May 31, 1966 F. R. McELLIGATT 3,253,327

MANUALLY OPERABLE INSERTING TOOL

Filed Aug. 24, 1964

INVENTOR.
FRANCIS R. McELLIGATT.
BY [signature]

United States Patent Office | 3,253,327
Patented May 31, 1966

3,253,327
MANUALLY OPERABLE INSERTING TOOL

Francis R. McElligatt, Detroit, Mich., assignor to Burroughs Corporation, Detroit, Mich., a corporation of Michigan Filed Aug. 24, 1964, Ser. No. 391,545
5 Claims. (Cl. 29—206)

This invention pertains generally to inserting tools and more particularly to hand tools for inserting devices having two parallel prongs extending from opposite ends of an integral cross member.

In the past, difficulty has been experienced in inserting electrical component leads into circuit boards where the leads must be force-fit into the holes of the board. The components themselves are fragile and may be quite small. The lead wires are slender and easily deformed, whereas it is important for many electronic reasons that the leads be straight and orthogonal to the board. The connections between the leads and the components, although easily broken, must be undisturbed and in a sealed condition.

Previous methods of insertion of such leads have included grasping the preformed component by its body, either manually or with plier-like tools, and pushing it in. This causes all the inserting force to be exerted at the junction of the lead and the body of the component. Thus, breakage of the lead at this point is not uncommon. Also the fragile glass or ceramic coated components may be damaged or the leads bent by pliers.

Another method was to grasp one of the leads with pliers or tweezers and push it directly into the board. This method is time consuming in that it requires two operations to insert the component and has the added disadvantage that the leads are likely to be bent or damaged by the pliers.

In any operation entailing the manual insertion of small, two-pronged devices into material offering resistance to the insertion, problems are often encountered because of the difficulty in holding the device perpendicular to the surface and in maintaining equal pressure on both prongs.

It is therefore an object of my invention to provide a device for facilitating the manual insertion into a surface, in one operation, of devices having two parallel prongs extending from opposite ends of an integral cross member.

A further object is to provide a hand tool for inserting leads of small electrical components into circuit boards with adjustability for width of separation of the leads.

Another object is to improve hand tools for inserting leads of electrical components into circuit boards by supporting the leads along their length.

In carrying out the objects of my invention, I provide a set of coacting jaws having corresponding longitudinal grooves in their interior faces at the open end and having a back-up member affixed to one jaw for support to the device being inserted. An adjustment means limits the closure of the jaws to hold a device, whose prongs are preformed, to the desired spacing.

In practice a preformed device is placed in the jaws with its prongs outwardly disposed in the grooves and its cross member against the back-up member. The tool is manually held closed on the prongs and they are then pushed into the selected surface.

Various other objects, advantages, and features of the invention will become more fully apparent from the following specification, appended claims, and accompanying drawings in which:

Figure 1:
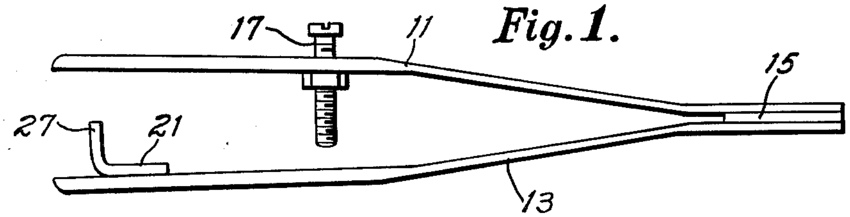
FIG. 1 is a side view of the inserting tool showing the back-up member and the adjustment screw.

My invention can be best understood by referring to the following detailed specification of the illustrated embodiment:

As shown in FIG. 1, flexible arm 11 is joined to a second flexible arm 13 at one end with spacer 15 to form coacting jaws. Arms 11 and 13 are shaped so that their end portions will be substantially parallel for normal spacing of the jaws. Adjustment screw 17 through a threaded hole in arm 11 limits their closure.

Figures 2, 3, 4, 5:
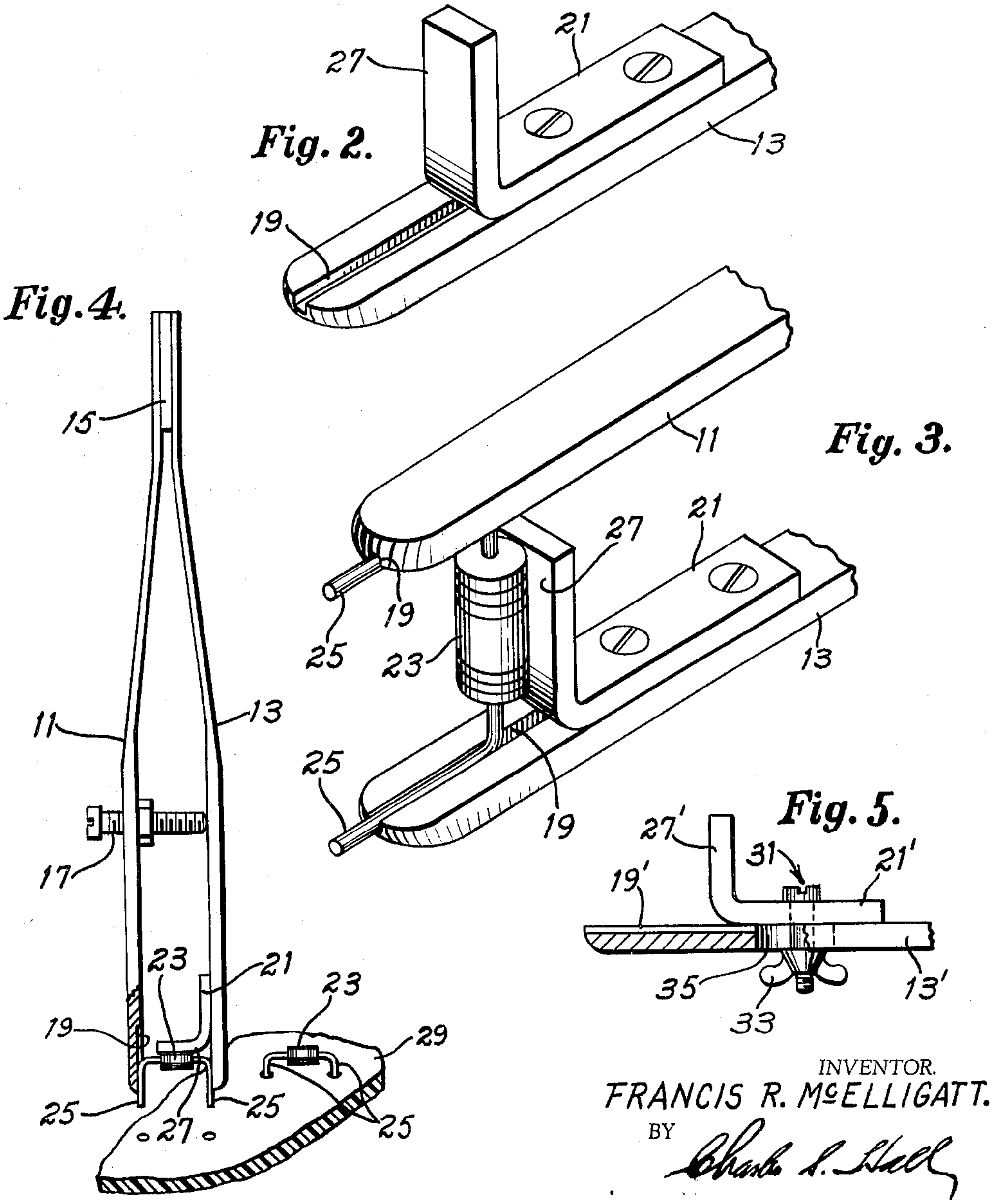
FIG. 2 is an isometric view of the end portion of an arm having a back-up member affixed thereto.
FIG. 3 shows an isometric view of the end portion of the jaws with an electrical component disposed therein for insertion.
FIG. 4 is a side view of the inserting tool, partially broken away, with a component placed therein for insertion into the holes of the circuit board.
FIG. 5 is a side view of the end portion of an arm with the back-up member attached thereto for longitudinal adjustment.

FIG. 2 shows longitudinal groove 19 in the end of arm 13. L-shaped back-up member 21 has one leg fastened to arm 13. The other leg extends substantially at right angles to arm 13 proximate the inner end of groove 19. A corresponding groove 19 is cut in arm 11 as can be seen in FIG. 3.

In operation, a component 23, for example, is set in the jaws as shown in FIGS. 3 and 4 with its leads 25 outwardly disposed in the grooves 19 and its body resting against the bearing face 27 of back-up member 21. The component is inserted into the circuit board 29 by holding the inserter manually by the jaws and pushing the leads 25 into the selected holes. Adjustment screw 17 is set so the tool will hold snugly a component 23 whose leads 25 are preformed to fit in selected holes.

The end portion of an arm 13 is shown in FIG. 5 with the back-up member 21 attached thereto for longitudinal adjustment by any convenient means, such as bolt 31 and wing nut 33 through slot 35. The adjustment is provided to enable the tool to accommodate components having various lead lengths.

Although the detailed description has been given in relation to the insertion of electrical components into circuit boards, it can be seen that my invention is useful in inserting into a surface any device having two parallel prongs extending from opposite ends of an integral cross member.

I claim:

1. A hand tool for inserting into a surface devices having two parallel prongs extending from opposite ends of an integral cross member comprising
   two coacting jaws having corresponding longitudinal grooves in the interior faces of their open end, and
   a back-up member attached to one of said jaws proximate the inner end of its groove whereby a device placed in said tool with its cross member against said back-up member and its prongs outwardly disposed in said grooves is held for insertion into a surface.

2. The device of claim 1 including adjustable means for limiting the closure of said jaws to hold devices having preselected separation of their prongs.

3. The device of claim 1 wherein said back-up member is longitudinally adjustable on said jaw.

4. A hand tool for inserting the leads of electrical components into circuit boards comprising
   two flexible elongated arms,
   means for joining said arms at one end to form coacting jaws,
   an adjustment screw through one of said arms for limiting the closure of said jaws, opposing longitudinal grooves in the interior faces of said arms extending inwardly from the open end of said jaws, and a back-up member attached to the interior face of one of said arms whereby a preformed component placed in said tool with its body against said back-up member and its leads outwardly disposed in said grooves is held for insertion into holes in said circuit board.

5. The device of claim 4 wherein said back-up member is longitudinally adjustable on said arm.

References Cited by the Examiner

UNITED STATES PATENTS

| | | | |
|---|---|---|---|
| 2,894,424 | 7/1959 | Vaughan | 81—43 X |
| 3,121,282 | 2/1964 | Donce | 29—206 |
| 3,136,040 | 6/1964 | Bauer et al. | 29—206 X |

JOHN F. CAMPBELL, *Primary Examiner.*

THOMAS H. EAGER, *Examiner.*